United States Patent [19]

Feinberg

[11] Patent Number: 5,680,045

[45] Date of Patent: Oct. 21, 1997

[54] GRASE-TYPE MR PULSE SEQUENCES

[76] Inventor: David A. Feinberg, 41 Hanzel Rd., Shokan, N.Y. 12481-5319

[21] Appl. No.: 504,298

[22] Filed: Jul. 20, 1995

[51] Int. Cl.[6] .................................................. G01V 3/00
[52] U.S. Cl. .................................... 324/309; 324/307
[58] Field of Search .................................... 324/307, 309, 324/314, 312; 128/653.2

[56] References Cited

U.S. PATENT DOCUMENTS

| | | | |
|---|---|---|---|
| 4,901,020 | 2/1990 | Ladebeck et al. | 324/309 |
| 5,001,429 | 3/1991 | Constable et al. | 324/312 |
| 5,043,665 | 8/1991 | Kuhara et al. | 324/309 |
| 5,168,226 | 12/1992 | Hinks | 324/309 |
| 5,270,654 | 12/1993 | Feinberg et al. | 324/309 |
| 5,304,929 | 4/1994 | Fang et al. | 324/309 |
| 5,361,028 | 11/1994 | Kanayama et al. | 324/309 |
| 5,508,612 | 4/1996 | Kanazawa | 324/309 |
| 5,521,505 | 5/1996 | Kohno | 324/309 |

*Primary Examiner*—Louis M. Arana
*Attorney, Agent, or Firm*—Mark H. Jay

[57] ABSTRACT

A plurality of non-overlapping bands is established in k-space. Each band includes a set of lines to be read out between a maximum phase-encoding gradient and a minimum phase-encoding gradient. Similarly, an identical plurality of temporally sequential and non-overlapping subsequences of pulses are established in the MR pulse sequence. Each subsequence corresponds to one and only one of the bands and reads out lines of MR data at phase-encoding gradients that are between the maximum and minimum phase-encoding gradients for that corresponding one. Lines of MR data are read out using the MR pulse sequence and the k-space bands are filled with lines of MR data. Advantageously, the first subsequence is used to fill up the center band in k-space.

8 Claims, 5 Drawing Sheets

GRASE-TYPE MR PULSE SEQUENCES

BACKGROUND OF THE INVENTION

The invention relates to diagnostic imaging, and more particularly relates to magnetic resonance (MR) imaging. In its most immediate sense,, the invention relates to MR pulse sequences.

In MR imaging, an MR pulse sequence is used to drive the RF and gradient coils of an MR scanner and the thereby-derived lines of MR data are ordered into a so-called k-space matrix. When the k-space matrix has been filled with lines of MR data, the matrix is subjected to Fourier transformation, which produces the MR image.

Within a k-space matrix, the lines of MR data are organized by the phase-encoding gradients at which the lines are acquired. For example, in a 256-line so-called "full Fourier" k-space matrix, the top line is a line of MR data acquired at a phase-encoding gradient of +128, the next line is a line of MR data acquired at a phase-encoding gradient of +127, the center line is a line of MR data acquired at a phase-encoding gradient of 0, the next to last line is a line of MR data acquired at a phase-encoding gradient of −126 and the last line is a line of MR data acquired at a phase-encoding gradient of −127. (In a so-called "half Fourier" k-space matrix, the lines of MR data are acquired between an extreme phase-encoding gradient and a phase-encoding gradient of 0.)

It has long been known that as a consequence of the mathematics of Fourier transformation, different regions of the k-space matrix make different contributions to the Fourier-transformed MR image. The center region, where lines of MR data are acquired at phase-encoding gradients equal to or close to 0, contributes most of the contrast in the MR image. As the k-space matrix is enlarged to encompass lines of MR data acquired at more extreme phase-encoding gradients, the additional lines of MR data contribute little to image contrast, but much to image resolution.

It has likewise long been known that T2 decay in living tissue degrades MR image quality. This is because T2 decay causes a progressive diminution of amplitude of the lines of MR data acquired during a single MR pulse sequence. As a result, within a single MR pulse sequence, later-acquired lines of MR data have a poorer signal-to-noise ratio than earlier-acquired lines of MR data.

The above-discussed phenomena have particularly pronounced effects when using long MR pulse sequences of the gradient and spin echo (GRASE) type. In GRASE-type MR pulse sequences, which are described in U.S. Pat. No. 5,270,654, the readout gradient is reversed, and the phase-encoding gradient is altered, at least twice after each RF refocussing pulse. Furthermore, in GRASE-type MR pulse sequences, the phase-encoding gradients are interleaved. As will be seen below, in a long GRASE-type MR pulse sequence, the diminution of signal amplitude resulting from T2 decay combined with the interleaving of the phase-encoding gradients causes the amplitude of the lines of MR data in k-space to be strongly periodic, i.e. amplitude-modulated. This amplitude modulation causes ghost artifacts (faint copies of real image data) to appear in the Fourier-transformed MR image.

One object is to provide a method of acquiring MR data that will acquire MR data quickly and with reduced levels of ghosting artifacts.

Another object is to provide such a method that will cause the central lines of MR data in k-space to be read out with maximum amplitude and minimum signal-to-noise ratio.

Another object is to provide such a method that is suitable for "half Fourier" MR imaging.

Yet a further object is, in general, to improve on known pulse sequences and methods used in MR imaging.

In accordance with the invention, a plurality of non-overlapping bands is established in k-space. Each band includes a set of lines to be read out between a maximum phase-encoding gradient and a minimum phase-encoding gradient. Similarly, an identical plurality of temporally sequential and non-overlapping subsequences of pulses are established in the MR pulse sequence. Each subsequence corresponds to one and only one of the bands and reads out lines of MR data at phase-encoding gradients that are between the maximum and minimum phase-encoding gradients for that corresponding one. Lines of MR data are read out using the MR pulse sequence and the k-space bands are filled with lines of MR data.

By establishing a correspondence between bands in k-space and portions of the MR pulse sequence used to read out lines of MR data, it is possible to optimize the data acquisition process. In accordance with the preferred embodiment, amplitude modulation in k-space is reduced by accepting some degree of phase modulation in k-space. The resulting Fourier-transformed MR image is better overall.

BRIEF DESCRIPTION OF THE DRAWINGS

The invention will be better understood with reference to the following illustrative and non-limiting drawings, in which.

DETAILED DESCRIPTION OF PREFERRED EMBODIMENTS

Figure 1:
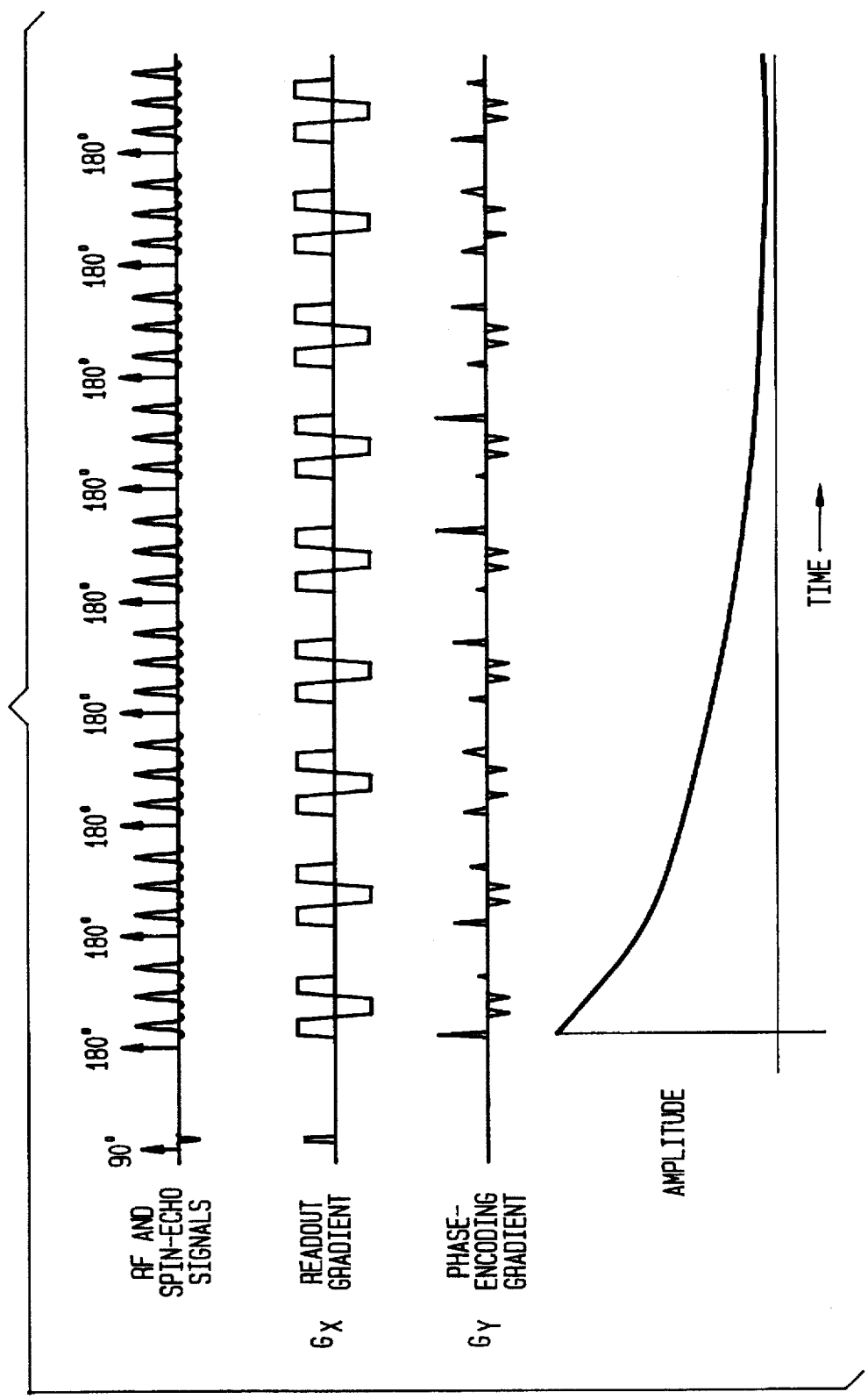
FIG. 1 shows a conventional GRASE-type MR pulse sequence and shows how T2 decay progressively reduces the amplitude of spin echo and gradient echo signals.

The exemplary GRASE-type MR pulse sequence schematically illustrated in FIG. 1 is in accordance with the disclosure of U.S. Pat. No. 5,270,654. In this example, there are nine RF refocussing pulses and the readout gradient is reversed twice after each RF refocussing pulse. Therefore, three gradient-recalled echo signals (one spin echo signal in the center, with one gradient echo signal on either side) are read out after each RF refocussing pulse. As a result, the FIG. 1 MR pulse sequence produces twenty seven (nine RF refocussing pulses, each followed by three echo signals) echo signals. As is also shown in FIG. 1, T2 decay progressively diminishes the amplitude of the induced echo signals; later-induced echo signals have amplitudes which are less than those of earlier-induced echo signals.

As described in U.S. Pat. No. 5,270,654, the gradients of the echo signals are interleaved. This interleaving determines the order in which the k-space matrix is filled with lines of MR data. Since there are twenty seven lines of data which are read out at different phase-encoding gradients, and since the phase-encoding is interleaved, the first line of MR data is read out at a phase-encoding gradient of +13, the second line of MR data is read out at a phase-encoding gradient of +4, and the third line of MR data is read out at a phase-encoding gradient of −5. The fourth line of MR data is then read out at a phase-encoding gradient of +12, the fifth at a phase-encoding gradient of +3, and the sixth at a phase-encoding gradient of −6.

Figure 2:
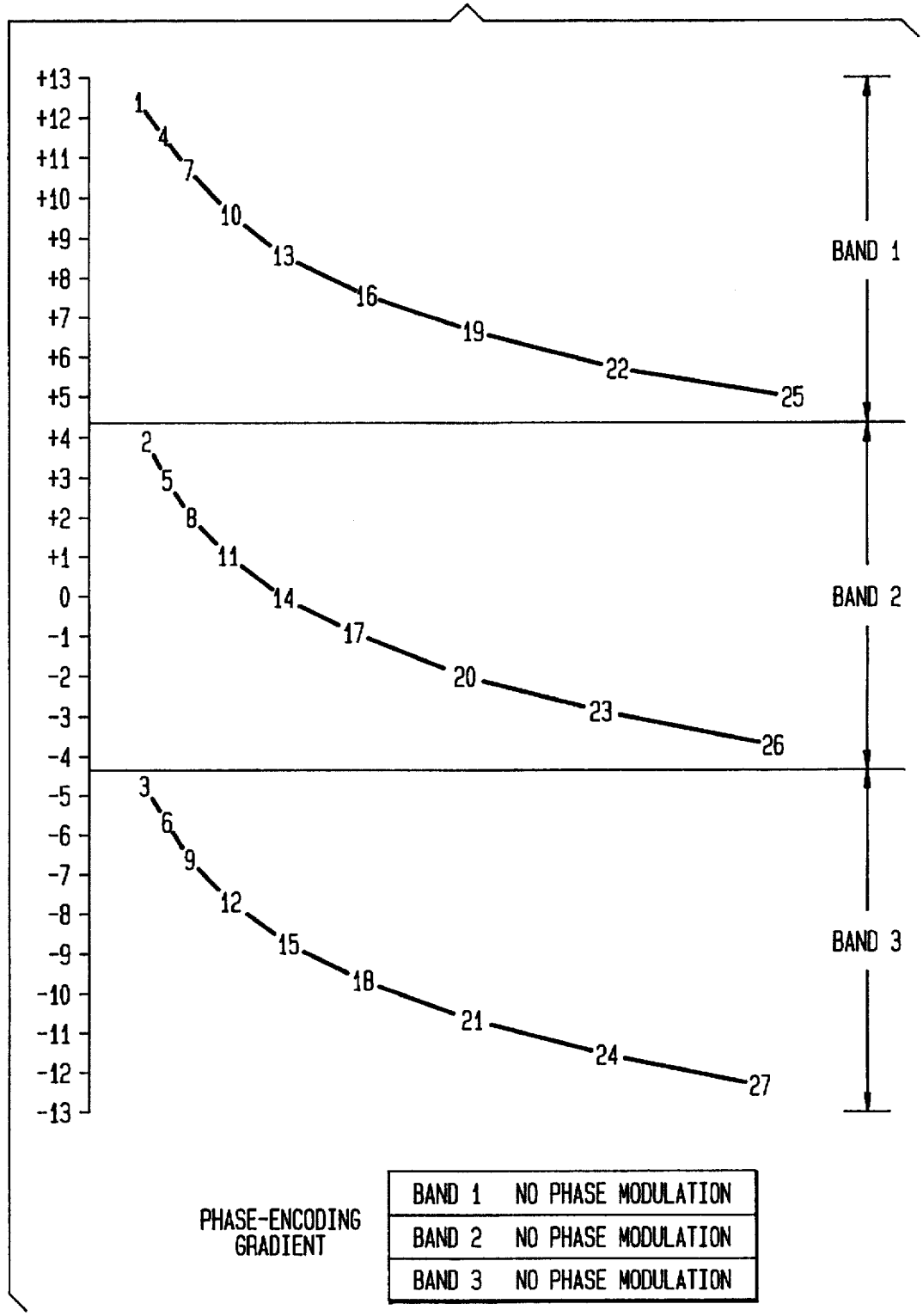
FIG. 2 shows a k-space matrix, filled with lines of MR data read out with the MR pulse sequence of FIG. 1, illustrating the order in which the k-space is filled with lines of with MR data and the strong amplitude modulation in that data.

In FIG. 2, each phase-encoding gradient is horizontally aligned with a number that represents the temporal position, within the MR pulse sequence, at which the corresponding line of MR data is read out. The spacing between the Y axis and the temporal position number increases with decreasing amplitude of the induced echo signal. This graphic representation illustrates that the data in the k-space matrix is highly amplitude-modulated and periodic; there are three bands of lines (these three bands are indicated as Band 1, Band 2 and Band 3 in FIG. 2) within k-space within which the amplitude of the induced echo signals varies greatly, and in the identical manner. (There are three such bands because, by assumption, the readout gradient is twice reversed after each RF refocussing pulse, causing three echo signals to be induced after each RF refocussing pulse.)

When the k-space data is subjected to Fourier transformation to produce an MR image, the amplitude modulation illustrated in FIG. 2 is decoded as multiple images of diminishing contrast and regular spacing. These ghost artifacts are distracting and interfere with the diagnostic quality of the final MR image.

Figure 3:
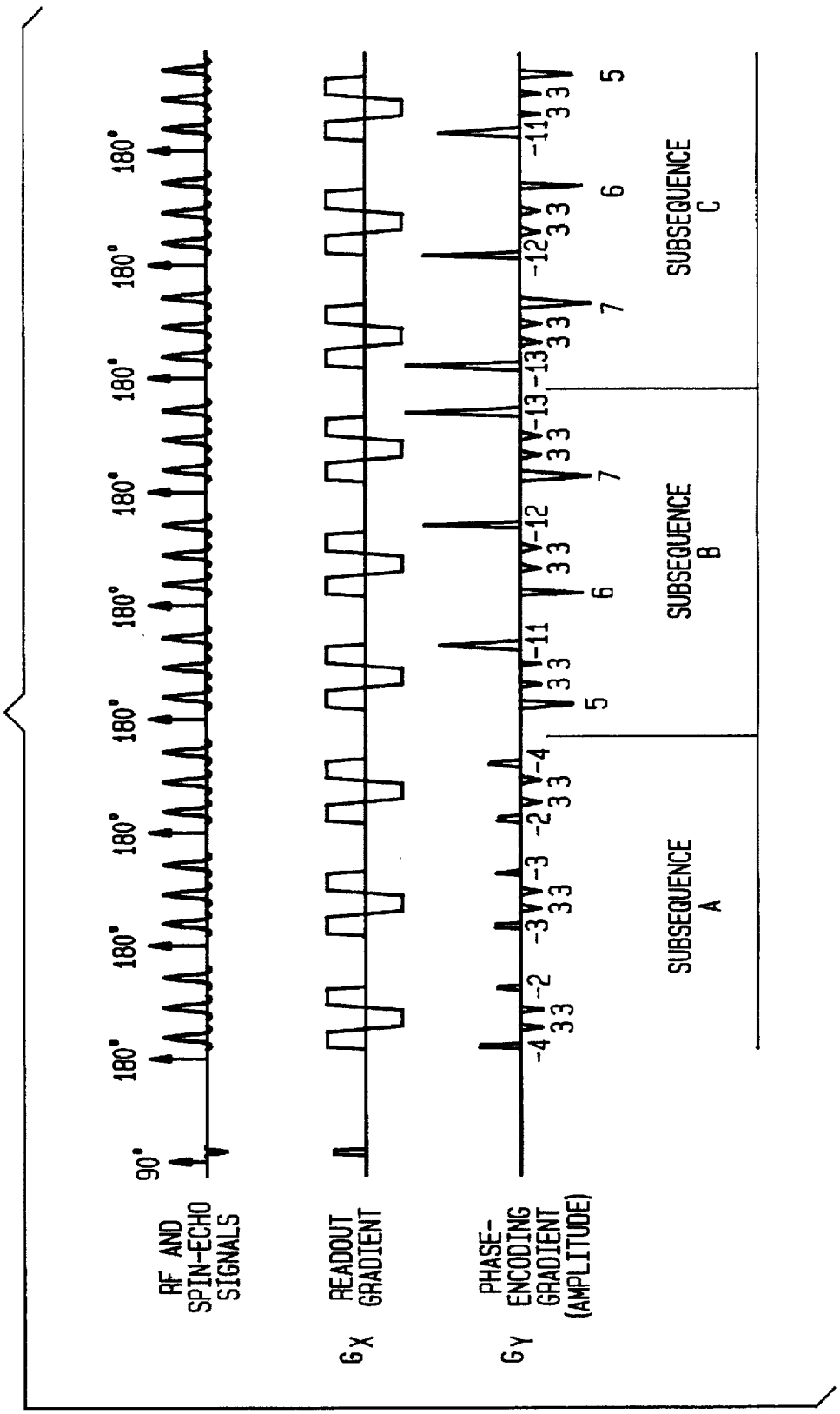
FIG. 3 shows an MR pulse sequence in accordance with a preferred embodiment of the invention.
Figure 4:
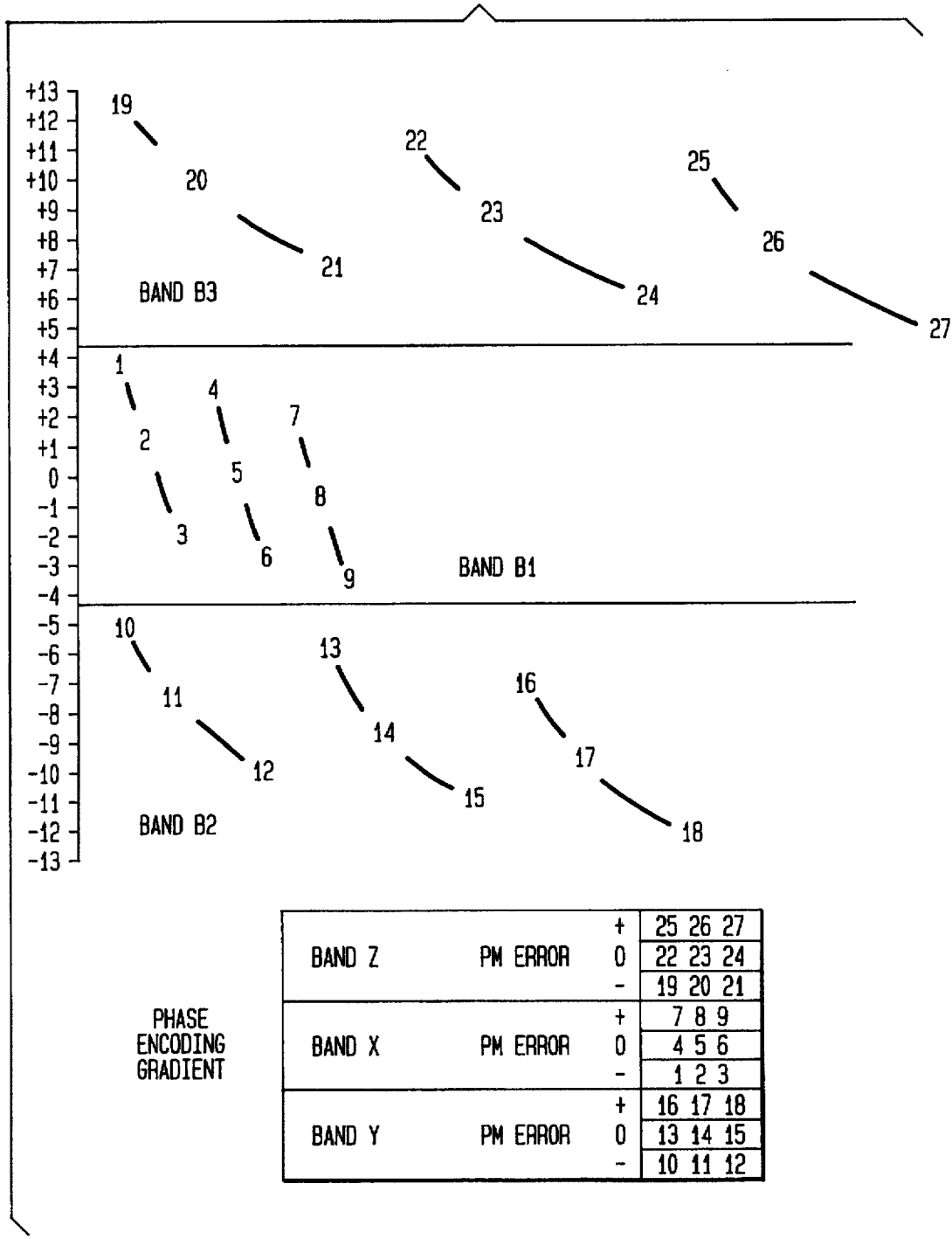
FIG. 4 shows the temporal order in which the k-space matrix is filled with lines of MR data read out with the MR pulse sequence of FIG. 3 and the reduced amplitude modulation in that data.

In accordance with the invention as illustrated in FIGS. 3 and 4, a correspondence is established between the bands in the k-space matrix and subsequences in the MR pulse sequence. FIG. 3 shows that an MR pulse sequence in accordance with the preferred embodiment has three subsequences, Subsequence A, Subsequence B and Subsequence C. FIG. 4 shows that the k-space matrix is divided into three bands: Band B1, Band B2 and Band B3. In accordance with the preferred embodiment of the invention, Subsequence A corresponds to Band B1, Subsequence B corresponds to Band B2 and Subsequence C corresponds to Band B3. Thus, the first nine lines of MR data read out during the FIG. 3 pulse sequence (i.e. during Subsequence A) fill up the central band (Band B1) of the k-space matrix, i.e. the lines of MR data that are read out between phase-encoding gradients from +4 to −4, inclusive. The next nine lines of MR data read out during the FIG. 3 MR pulse sequence (i.e. during Subsequence B) fill up the lowest k-space band (Band B2, which includes lines read out between phase-encoding gradients between −5 and −13, inclusive. The last nine lines of MR data read out during the FIG. 3 pulse sequence (i.e. during Subsequence C) fill up the remaining k-space band (Band B3, which includes lines read out between phase-encoding gradients of +5 to +13, inclusive).

This correspondence between bands in the k-space matrix (here, Bands B1, B2 and B3) and subsequences in the MR pulse sequence (here, Subsequences A, B and C) reduces the degree of amplitude modulation shown in FIG. 2. As can be seen from FIG. 4, the amplitude modulation within the k-space matrix is not as pronounced but phase modulation has been introduced within the k-space matrix. The reduction in amplitude modulation is reflected in the smaller variation of relative amplitude. The phase modulation is also shown by the presence of multiple curves within each band; within each band, signals having negative, zero and positive phase errors are identified.

In accordance with this first preferred embodiment, the central region of k-space is filled with higher-quality data, i.e. data having a maximum signal-to-noise ratio. This is because the initial spin echo and gradient echo signals generated by Subsequence A have maximum amplitudes. Thus, not only are ghost artifacts reduced, but contrast in the Fourier-transformed MR image is increased as well because the central region of the k-space matrix determines the contrast in the Fourier-transformed image. Where contrast is expected to be adequate and a higher-resolution image is desired, the correspondence between the bands in the k-space matrix and the subsequences in the MR pulse sequence can be altered so that the higher-quality data is used to fill non-central band(s).

In further accordance with the first preferred embodiment, it is necessary to hold phase modulation errors to an acceptable level. This is accomplished by using GRASE-type interleaving within each band of k-space, as is illustrated in FIG. 4.

Figure 5:
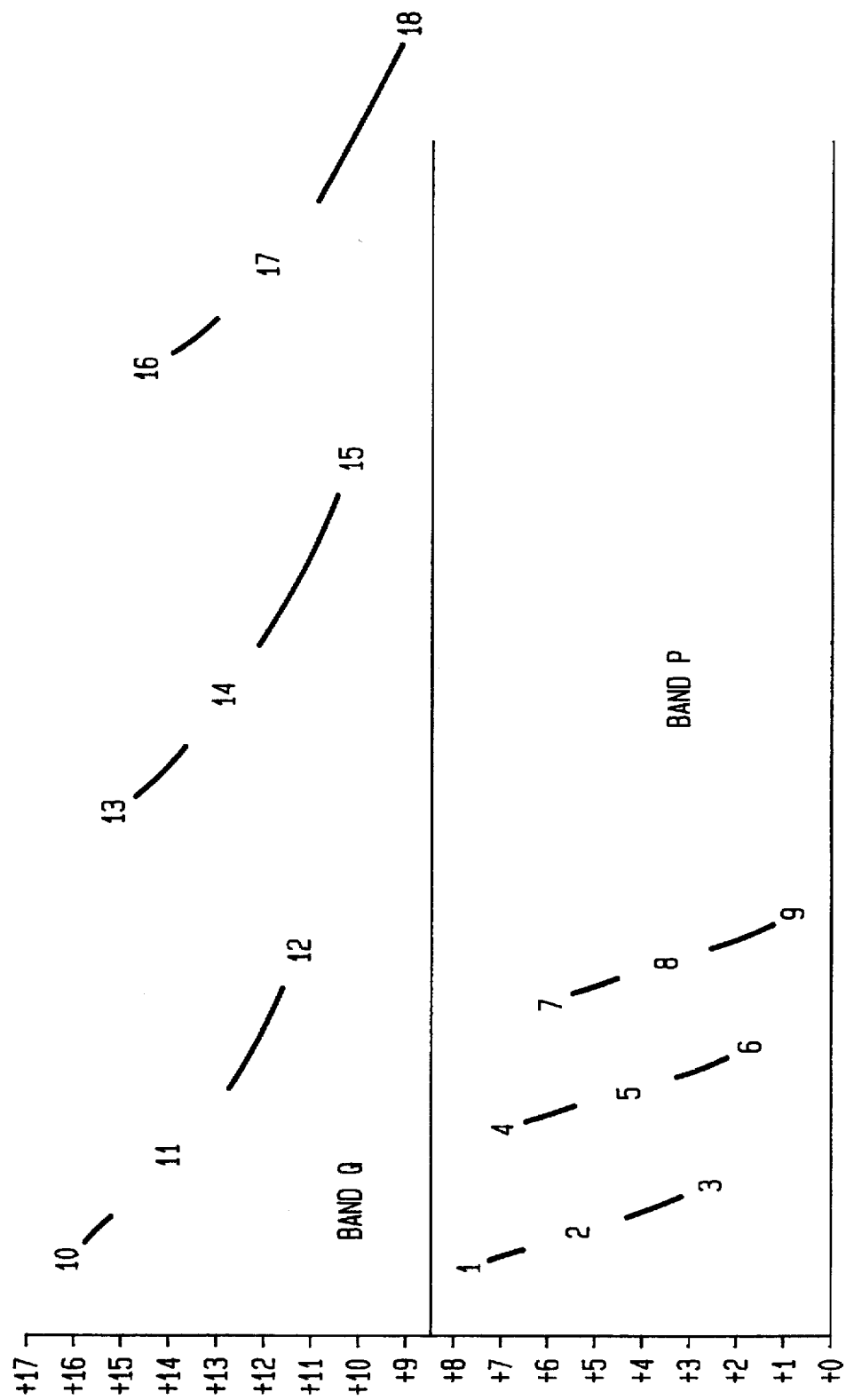
FIG. 5 shows a k-space matrix for a "half Fourier" GRASE-type MR pulse sequence composed of two subsequences.

In accordance with a second preferred embodiment, which can be used for "half Fourier" imaging, an MR pulse sequence is used to acquire only lines of MR data with a zero or a positive phase-encoding. This allows an MR image to be acquired in half the usual time, but at the expense of increased noise. FIG. 5 shows the k-space matrix for an eighteen line "half Fourier" GRASE-type MR pulse sequence that is made up of two subsequences. The FIG. 5 k-space matrix has two bands, namely Band P and Band Q. Band P corresponds to the initial subsequence in the MR pulse sequence and is positioned asymmetrically over the center of k-space to include $k_0$ on one side. Band Q corresponds to the final subsequence in the MR pulse sequence, positioned adjacent to Band P. The remaining fraction of k-space may be created using conventional "half Fourier" methods or by using "zero filling".

In the examples given, the various bands in the k-space matrix are of equal width and the subsequences are of equal duration. Although this is presently preferred, it is not necessary; the widths of the bands (and therefore the durations of the subsequences) may be made unequal. So, too, although the examples herein show either two or three bands in the k-space matrix, there may be more. Likewise, even though the present examples have one spin echo and two gradient echoes following each RF refocussing pulse, this is only preferred; if there are four alternations of the readout gradient, one spin echo and four gradient echo signals will follow each RF refocussing pulse.

Although a preferred embodiment has been described above, the scope of the invention is limited only by the following claims:

I claim:

1. A method of acquiring MR data by using an MR pulse sequence to acquire lines of MR data and filling a k-space matrix with such lines of data, comprising the following steps:

establishing, in the k-space matrix, a plurality of non-overlapping bands, each band including a set of lines to be read out between a maximum phase-encoding gradient and a minimum phase-encoding gradient;

establishing, in the MR pulse sequence, an identical plurality of temporally sequential and non-overlapping subsequences of pulses, each subsequence corresponding to one and only one of the bands and reading out lines of MR data at phase-encoding gradients that are between the maximum and minimum phase-encoding gradients for that corresponding one;

using said MR pulse sequence to read out lines of MR data; and filling the bands with lines of MR data.

2. The method of claim 1, wherein the bands are of identical phase-encoding width and the subsequences are of identical duration.

3. The method of claim 1, wherein there is a center band which includes a line of MR data read out at a phase-encoding gradient that is at least approximately zero, wherein there is an initial subsequence in which lines of MR data are read out between the maximum and minimum phase-encoding gradients of the center band, and wherein the center band is completely filled with lines of MR data at the end of the initial subsequence.

4. The method of claim 1, wherein the MR pulse sequence is of the gradient and spin echo (GRASE) type.

5. The method of claim 4, wherein there are three bands and three subsequences.

6. The method of claim 1, wherein the k-space matrix includes lines of MR data read out between positive and negative phase-encoding gradients and wherein there is a center band which includes a line of MR data read out at an approximately zero phase-encoding gradient.

7. The method of claim 1, wherein the k-space matrix includes only lines of MR data read out between an approximately zero phase-encoding gradient and an extreme phase-encoding gradient and wherein an initial one of the subsequences reads out a line of MR data at said approximately zero phase-encoding gradient.

8. A method of acquiring MR data using an MR pulse sequence of the gradient and spin echo (GRASE) type to read out lines of MR data and filling a k-space matrix with such lines of data, comprising the following steps:

establishing, in the k-space matrix, three non-overlapping bands of identical phase-encoding width, each band including a set of lines read out between a maximum phase-encoding gradient and a minimum phase-encoding gradient, and one of said bands being a center band and including a line of MR data acquired at phase-encoding gradient which is at least approximately zero;

establishing, in the MR pulse sequence, three temporally sequential and non-overlapping subsequences of pulses, each subsequence corresponding to exactly one of the bands and reading out lines of MR data at phase-encoding gradients that are between the maximum and minimum phase-encoding gradients for that corresponding one, one of said subsequences being an initial subsequence and reading out a line of MR data at said at least approximately zero phase-encoding gradient;

initially filling said center band with lines of MR data; and subsequently filling the other two bands with lines of MR data.

* * * * *